(12) United States Patent
Pratt et al.

(10) Patent No.: US 8,585,915 B2
(45) Date of Patent: Nov. 19, 2013

(54) METHODS FOR FABRICATING SUB-RESOLUTION ALIGNMENT MARKS ON SEMICONDUCTOR STRUCTURES

(75) Inventors: David S. Pratt, Meridian, ID (US); Marc A. Sulfridge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1521 days.

(21) Appl. No.: 11/926,619

(22) Filed: Oct. 29, 2007

(65) Prior Publication Data
US 2009/0110878 A1 Apr. 30, 2009

(51) Int. Cl.
*B44C 1/22* (2006.01)

(52) U.S. Cl.
USPC .............. 216/41; 438/689; 438/947; 430/5; 430/22; 430/313

(58) Field of Classification Search
USPC .................... 430/5, 22, 313; 216/41
See application file for complete search history.

(56) References Cited

U.S. PATENT DOCUMENTS

| | | | |
|---|---|---|---|
| 4,564,585 A * | 1/1986 | Blaske et al. | 430/313 |
| 5,447,810 A | 9/1995 | Chen et al. | |
| 6,146,969 A | 11/2000 | Tan et al. | |
| 6,200,903 B1 * | 3/2001 | Oh et al. | 438/705 |
| 6,300,018 B1 * | 10/2001 | Dilley et al. | 430/5 |
| 6,403,267 B1 * | 6/2002 | Tzu et al. | 430/5 |
| 6,902,986 B2 * | 6/2005 | Maltabes et al. | 438/401 |
| 7,008,738 B2 | 3/2006 | Dulman et al. | |
| 7,141,338 B2 | 11/2006 | Chen et al. | |
| 7,183,226 B2 | 2/2007 | Lee et al. | |
| 2006/0057815 A1 | 3/2006 | Kim | |
| 2008/0153249 A1 * | 6/2008 | Yang | 438/401 |

FOREIGN PATENT DOCUMENTS

| | | |
|---|---|---|
| KR | 10-2004-0001454 A | 1/2004 |
| WO | WO 2006/101762 A1 | 9/2006 |

OTHER PUBLICATIONS

International Search Report for PCT/US2008/079209, dated May 18, 2009, three (3) pages.
Written Opinion of the International Searching Authority for PCT/US2008/079209, dated May 18, 2009, four (4) pages.
U.S. Appl. No. 11/635,902, filed Dec. 8, 2006, Method and System for Fabricating Semiconductor Components with Through Interconnects and Back Side Redistribution Conductors.
U.S. Appl. No. 11/831,247, filed Jul. 31, 2007, Semiconductor Devices and Methods of Manufacturing Semiconductor Devices.
www.jsrmicro.com/pro_pack_WPR.html, 2006, 3 pages.
Preliminary Rejection from Korean Intellectual Property Office for corresponding application No. KR10-2010-7009318, dated Jul. 13, 2011.

* cited by examiner

*Primary Examiner* — Shamim Ahmed
(74) *Attorney, Agent, or Firm* — TraskBritt

(57) ABSTRACT

A method of fabricating semiconductor structures comprising sub-resolution alignment marks is disclosed. The method comprises forming a dielectric material on a substrate and forming at least one sub-resolution alignment mark extending partially into the dielectric material. At least one opening is formed in the dielectric material. Semiconductor structures comprising the sub-resolution alignment marks are also disclosed.

18 Claims, 4 Drawing Sheets

METHODS FOR FABRICATING SUB-RESOLUTION ALIGNMENT MARKS ON SEMICONDUCTOR STRUCTURES

TECHNICAL FIELD

Embodiments of the invention relate generally to the fabrication of semiconductor structures and devices and, more specifically, to methods for forming sub-resolution alignment marks in or on a dielectric material of the semiconductor structures and devices, and to the resulting semiconductor structures and devices.

BACKGROUND

In fabricating semiconductor devices, interconnects that transmit signals from a circuit side of a substrate, which is also conventionally referred to as the "active surface," to a back side of the substrate are sometimes utilized. Interconnects that extend through the substrate from the circuit side to the back side are sometimes referred to as through interconnects. During fabrication of the semiconductor devices at the wafer level, through interconnects are sometimes referred to as through wafer interconnects ("TWI") or through silicon interconnects. The through interconnects are typically metal-filled vias formed in the substrate and are configured and positioned to electrically connect integrated circuits on the circuit side to electrical elements on the back side. The back side includes terminal contacts in electrical communication with the through interconnects, sometimes directly and sometimes through redistribution conductors.

As semiconductor devices become smaller and have higher input/output configurations, semiconductor manufacturers must fabricate through interconnects having increasingly smaller sizes and pitches without compromising performance. Through interconnects having a high electrical conductivity and a low parasitic capacitance provide the best performance. In addition to having good performance characteristics, it is advantageous for though interconnects to be capable of fabrication at the wafer level using conventional equipment and conventional processes. It is also advantageous to utilize as few process acts as possible in the fabrication of the semiconductor device to minimize costs and reduce defects. Conventional metal-filled through interconnects utilize multiple photopatterning acts, and may include both front side and back side processing. For example, the terminal contacts and pads for the terminal contacts are made separately utilizing multiple photopatterning acts, which adds considerable cost to the overall fabrication costs.

In order to achieve circuit continuity, a wafer upon which the semiconductor devices are ultimately to be formed is carefully aligned with a reticle or mask before conducting the photopatterning acts. Alignment is conventionally accomplished using a wafer stepper or aligner, which transfers a desired pattern from the reticle or mask onto a material present on the wafer. The wafer stepper uses alignment marks, also characterized as fiducials, on the wafer as a reference point to precisely align the reticle or mask to previously formed materials on the wafer. The alignment marks are typically formed on unused portions of the wafer, such as along a peripheral edge of the wafer or near scribe lines that separate locations of individual semiconductor dice, by etching a pattern of trenches in the underlying layer with a known orientation and spatial relationship. The wafer stepper typically uses light with a fixed wavelength to detect the position of the alignment marks on the wafer.

While conventional alignment processes are efficacious for many applications, these alignment processes are not reliable for back side processing of semiconductor devices having terminal contacts on the back side. Back side processing typically includes patterning and curing of a dielectric material on the back side of the substrate. The dielectric material functions as an etch mask for forming deep vias in the substrate. Openings, other than the vias, that extend through the dielectric material and expose underlying or overlying materials, such as any alignment marks, transfer to the substrate during subsequent processing acts, causing downstream processing issues. In addition, if a metal seed layer is present on the back side, then infrared ("IR") alignment techniques can not be used to align the front side alignment marks. IR techniques are currently used for back side alignment because the silicon substrate is transparent, which enables back side alignment using the alignment marks on the circuit side of the wafer. However, the metal seed material is not transparent to IR and, therefore, the metal seed material prevents subsequent alignment during the back side processing. To address this problem, unique vias or sets of unique vias can be formed on he back side of the substrate and used as alignment marks. These vias have a unique shape and pattern compared to other vias present on the substrate or on adjacent semiconductor dice. However, forming and detecting the unique vias in a consistent manner has proven to be an unreliable technique, leading to misalignment.

DETAILED DESCRIPTION

Figure 1A:
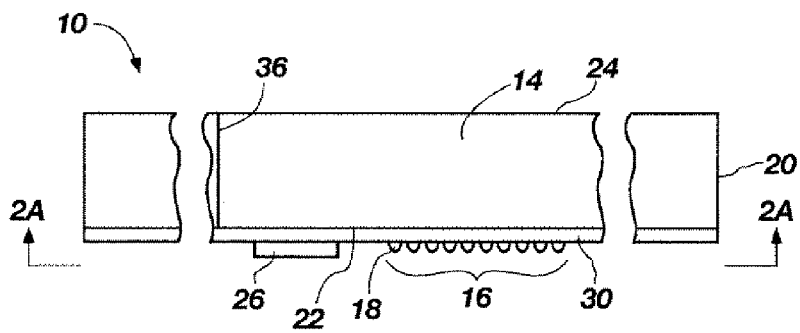
FIGS. 1A-1H are schematic, cross-sectional views during various stages of fabrication of forming semiconductor structures and semiconductor devices in accordance with embodiments of the invention.

A method of fabricating a semiconductor structure including a plurality of sub-resolution alignment marks is disclosed, as are semiconductor structures including the sub-resolution alignment marks. As used herein, the term "sub-resolution alignment marks" means and includes trenches, lines, bumps, ridges, or other features on the semiconductor structure having at least one dimension (e.g., width, length, or diameter) that is sized below a resolution limit, for a given wavelength of light, of a material on which or in which the features are formed. The sub-resolution alignment marks may be formed in the material at substantially the same time as other openings in the material, reducing the number of processing acts utilized to fabricate the semiconductor structure. To prevent transfer of he sub-resolution alignment marks into underlying materials, a portion of the material in which the sub-resolution alignment marks are formed remains over he underlying materials, protecting the underlying materials from subsequent processing acts.

In the following detailed description, reference is made to the accompanying drawings which form a part hereof and in which is shown by way of illustration specific embodiments in which the invention may be practiced. These embodiments are described in sufficient detail to enable a person of ordinary skill in the art to practice the invention. It is to be understood that other embodiments may be utilized, and that structural, logical, and electrical changes may be made without departing from the spirit and scope of the invention. The drawings presented herein are not meant to be actual views of any particular semiconductor structure or fabrication process thereof, but are merely idealized representations that are employed to describe the embodiments of the invention. Additionally, elements common between drawings may retain the same numerical designation.

The following description provides specific details, such as material types, material thicknesses, and processing conditions in order to provide a thorough description of embodiments of the invention. However, a person of ordinary skill in the art would understand that the embodiments of the invention may be practiced without employing these specific details. Indeed, the embodiments of the invention may be practiced in conjunction with conventional semiconductor fabrication techniques employed in the industry. In addition, the description provided below does not form a complete process flow for manufacturing a semiconductor structure or a semiconductor device, and the semiconductor devices described below do not form a complete electronic device. Only those process steps and semiconductor structures or semiconductor devices necessary to understand the embodiments of the invention are described in detail below. Additional processing acts to form a complete semiconductor device from the semiconductor structures or to form a complete electronic device from the semiconductor device may be performed by conventional fabrication techniques.

The materials described herein may be formed by any suitable deposition technique including, but not limited to, spin-coating, blanket coating, chemical vapor deposition ("CVD"), atomic layer deposition ("ALD"), plasma enhanced ALD, or physical vapor deposition ("PVD"). Alternatively, the materials may be grown. Depending on the specific material to be formed, the technique for depositing or growing the material may be selected by a person of ordinary skill in the art. While the materials may be formed as layers, the materials are not limited thereto and may be formed in other configurations.

The semiconductor device 2 (see FIGS. 1H and 2C) formed by embodiments of the invention may be an imager device that is configured for illumination of a sensor array and the pixels therein. While the description and drawings describe and illustrate embodiments of the invention in regard to back end processing of the imager device, the semiconductor device 2 may be an electronic signal device (i.e., a microprocessor) or a memory device including, but not limited to, a volatile memory device (e.g., a DRA device) and non-volatile memory devices (e.g., a Flash memory device). By way of non-limiting example, embodiments of the invention may also be used to form a back side redistribution layer ("RDL") on a DRAM device. However, embodiments of the invention may also be used in so-called "front end" or "front side" processing, such as metal plating or alignment processes.

Fabricating the semiconductor structures 4A, 4B (see FIGS. 1C and 1D) may include fabrication acts substantially similar to those described in U.S. patent application Ser. No. 11/635,902, filed Dec. 8, 2006, now U.S. Pat. No. 7,531,443, issued May 12, 2009, titled "METHOD AND SYSTEM FOR FABRICATING SEMICONDUCTOR COMPONENTS WITH THROUGH INTERCONNECTS AND BACK SIDE REDISTRIBUTION CONDUCTORS,", the disclosure of which is incorporated herein by reference in its entirety. The semiconductor structures 4A, 4B may be fabricated as illustrated in FIGS. 1A-1D, which are partial, cross-sectional views of a work piece 10 during various processing acts during the fabrication of the semiconductor structures 4A, 4B. The semiconductor structures 4A, 4B may be further processed, as illustrated in FIGS. 1E-1H, to produce the semiconductor device 2. A plurality of semiconductor devices 2 may be simultaneously fabricated side-by-side on and/or in the substrate 14. However, for purposes of illustration, only a portion of the work piece 10 that is to include a single semiconductor device 2 is illustrated in FIGS. 1A-2C. The work piece 10 may, in actuality, include the plurality of semiconductor devices 2, which are subsequently singulated from the work piece 10 to provide the plurality of individual and discrete semiconductor devices 2.

The work piece 10 may include a substrate 14, an image sensor die (or image sensor package) having an imager pixel array 16, a plurality of integrated circuits 18 in the imager pixel array 16, an electrical insulation material 30, and a plurality of substrate contacts 26, as illustrated in FIG. 1A. Additional integrated circuits (not shown) may be present on other regions of the substrate 14, such as for processing image data. The substrate 14, imager pixel array 16, integrated circuits 18, electrical insulation material 30, and substrate contacts 26 may be formed by conventional techniques, which are not described in detail herein. As used herein, the term "substrate" means and includes a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-geranium, germanium, gallium arsenide, gallium nitride, or indium phosphide. The substrate 14 includes a front surface 22 and a back surface 24 on an opposing side of the front surface 22. The front surface 22 may be an active surface of the substrate 14 and, thus, includes active regions including, but not limited to, the imager pixel array 16 and the integrated circuits 18. The front surface 22 of the substrate 14 is sometimes referred to in the art as the so-called "front side" and the back surface 24 is sometimes referred to in the art as the so-called "back side." The terms including, but not limited to, "front," "back," "outer," "upper," "underlying," and "overlying" are used in this description of the invention for convenience. These terms are used to denote relative directions, positions, and orientations of features depicted in the drawings, and are not in reference to gravity. For example, the work piece 10 or semiconductor structures 4A, 4B may, in practice, be oriented in any suitable direction during fabrication or use. The front surface 22 and the back surface 24 are substantially planar and are substantially parallel to one another.

During fabrication, a wafer 20 that includes a plurality of substantially identical substrates 14 (see also FIG. 2A) may be used. Individual semiconductor devices 2 may be produced from each of the substrates 14 of the wafer 20. The wafer 20 may be a so-called "full thickness" wafer or a so-called "thinned" wafer, from which a substantial thickness of wafer material has been removed from the back side. Streets or scribe areas 36 between adjacent substrates 14 are indicated by a vertical line (see FIGS. 1A-1H) and spaces on the wafer 20 (see FIG. 2A). The substrate 14 may also be present on a panel, a leadframe, or a circuit board including multiple substrates 14.

The substrate contacts 26 may be in electrical communication with the integrated circuits 18. The substrate contacts 26 may include bond pads or redistribution contacts (i.e., contacts formed in conjunction with an RDL). The substrate contacts 26 may be formed from a conductive, bondable metal, such as aluminum or copper, or from multiple metals, such as aluminum-nickel-gold, aluminum-nickel-solder, copper-palladium, or aluminum-copper. For simplicity, only one substrate contact 26 is illustrated on the work piece 10 in FIG. 1A, and only eight substrate contacts 26 are illustrated on the work piece 10 in FIG. 2A. However, the work piece 10 may, in actuality, include from tens to hundreds of substrate contacts 26 arranged in a desired configuration, such as a center array, an edge array, or an area array. Also, while the substrate contacts 26 are illustrated as having a generally square peripheral outline (see FIG. 2A), the substrate contacts 26 may have any polygonal shape including, but not limited to, square, rectangular, circular, triangular, or oval. A size of the substrate contacts 26 may be selected as desired based on the intended use for the semiconductor structures 4A, 4B. By way of non-limiting example, the substrate contacts 26 may have a width on each side of from approximately 5 µm to approximately 200 µm. The substrate contacts 26 may be substantially planar pads or lands, or may have other shapes including, but not limited to, projections in the form of bumps, studs, pillars, or volcano-like shapes.

The electrical insulation material 30 may be formulated and positioned to electrically insulate the integrated circuits 18, additional integrated circuits outside the imager pixel array 16, and other electrical elements from the remainder of the substrate 14. The electrical insulation material 30 may be formed, by way of non-limiting example, from borophosphosilicate glass ("BPSG"), silicon dioxide ("SiO$_2$"), or a polyimide. For simplicity, the substrate contacts 26 are illustrated as being located on the electrical insulation material 30. However, internal conductors (not shown) may provide electrical paths between the substrate contacts 26 and the integrated circuits 18, between the substrate contacts 26 and the additional integrated circuits outside of the imager pixel array 16, and between the substrate contacts 26 and other electrical elements.

Figure 1B:
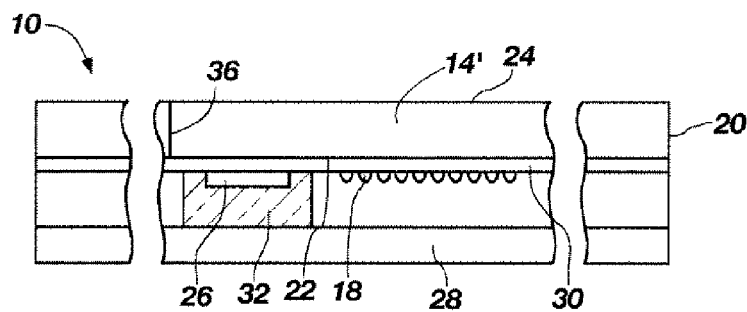

Spacers 32 may be formed on the front surface 22 of the substrate 14, as illustrated in FIG. 1B. In addition, a wafer scale carrier 28 may, optionally, be attached to the front surface 22 of the substrate 14. For some applications, such as processing of a full thickness wafer, the wafer scale carrier 28 may be eliminated. The size and geometry of he spacers 32 may be selected by a person of ordinary skill in the art. The spacers 32 may be formed from an electrically insulating material including, but limited to, a polymer, glass, or ceramic. The spacers 32 may be formed on the substrate contacts 26 by conventional techniques. Alternatively, an adhesive material (not shown) may be used to attach the wafer scale carrier 28, if present, to the front surface 22 of the substrate 14. The wafer scale carrier 28 may be formed from a glass or silicon material having a selected thickness and a selected peripheral outline. Since many of the subsequent processing acts are conducted from the back surface 24 of the substrate 14, the wafer scale carrier 28 may provide protection for the front surface 22 of the substrate 14, in addition to providing support. The spacers 32 and wafer scale carrier 28 may be removed after the subsequent processing acts are conducted.

A portion of the substrate 14 may be removed from he back surface 24 to form substrate 14', which is a so-called "thinned" substrate. The substrate 14 may have a thickness of up to approximately 700 µm. The portion of the substrate 14 may be removed by conventional techniques, such as by a mechanical planarization process, a chemical planarization process, a chemical mechanical planarization ("CMP") process, or an etching process, such as a wet etch, dry etch, or plasma etch process. The substrate 14' may have a thickness of from approximately 10 µm to approximately 300 µm.

A dielectric material 34 may be disposed on the back surface 24 of the substrate 14'. The dielectric material 34 may be used as an etch mask to define vias 44 and at least one sub-resolution alignment mark 40 (see FIG. 1D) on the semiconductor structures 4A, 4B. Since FIGS. 1A-1H are cross-sectional views, these drawings illustrate sub-resolution alignment mark 40 as a partial opening or trench in the dielectric material 34. However, a plurality of sub-resolution alignment marks 40 may be grouped together to form a pattern 42 (see FIGS. 2B, 2C, and 3A-3C) of sub-resolution alignment marks 40. The dielectric material 34 may be a photodefinable or photoimageable material, such as a positive tone or a negative tone photoresist material that has dielectric properties when exposed and cured. The dielectric material 34 may be selected to have a resolution limit that is greater than the desired dimensions of the sub-resolution alignment marks 40. By way of non-limiting example, the dielectric material 34 may have a resolution limit of greater than or approximately equal to 1.0 µm. As described in detail below and illustrated in FIG. 1C, the dielectric material 34 may be patterned to include openings 38 and the sub-resolution alignment marks 40. Since the resolution limit may be a function of the material used as the dielectric material 34, the dielectric material 34 may be selected based on the desired dimensions of the openings 38 and the subresolution alignment marks 40. The dielectric material 34 may be compatible with and adhere to the substrate 14'. In addition, the dielectric material 34 may be compatible with other materials deposited in contact with the dielectric material 34.

The dielectric material 34 may be disposed on the back surface 24 of the substrate 14' by conventional techniques including, but not limited to, spincoating, blanket deposition, a dry film process, or a spray-on process. The dielectric material 34 may be formed on the back surface 24 of the substrate 14' at a sufficient thickness to achieve the desired dimensions of the sub-resolution alignment marks 40 and the openings 38. The thickness of the dielectric material 34 may also be sufficient to provide substantially vertical sidewalls in the dielectric material 34, which acts as a mask during subsequent etch of the substrate 14'. The thickness of the dielectric material 34 may also be sufficient to provide sufficient resist budget or thickness for subsequent processing acts. By way of non-limiting example, the dielectric material 34 may be formed at a thickness of from approximately 5 µm to approximately 20 µm, such as at approximately 15 µm. If the material used as the dielectric material 34 utilizes a curing act the cure conditions may be determined by a person of ordinary skill in the an in accordance with the manufacturer's specification. Depending on the material used as the dielectric material 34, at least one of a pre-exposure bake or a post-exposure bake may also be utilized. These conditions may be determined by a person of ordinary skill in the art in accordance with the manufacturer's specification.

The dimensions of the openings 38 may be formed in the dielectric material 34 at a size at or above the resolution limit of the dielectric material 34, while the dimensions of the sub-resolution alignment marks 40 may be formed in the dielectric material 34 at a size below the resolution limit of the dielectric material 34. The dimensions of the sub-resolution alignment marks 40 may be from approximately 10% to approximately 75% of the resolution limit of the dielectric material 34. By way of non-limiting example, sub-resolution alignment marks 40 having dimensions of from approximately 0.4 μm to approximately 0.9 μm may be formed in the dielectric material 34. By way of non-limiting example, if the dielectric material 34 has a resolution limit of approximately 2 μm, the sub-resolution alignment marks 40 may be formed in the dielectric material 34 at approximately 0.5 μm.

Figure 2A:
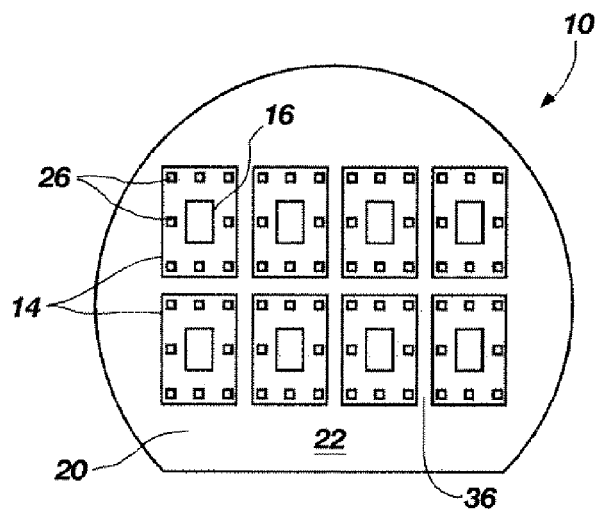
FIG. 2A is a schematic bottom view of embodiments of the semiconductor structures and semiconductor devices in accordance with embodiments of the invention taken along line 2A-2A of FIG. 1A.
Figure 2B:
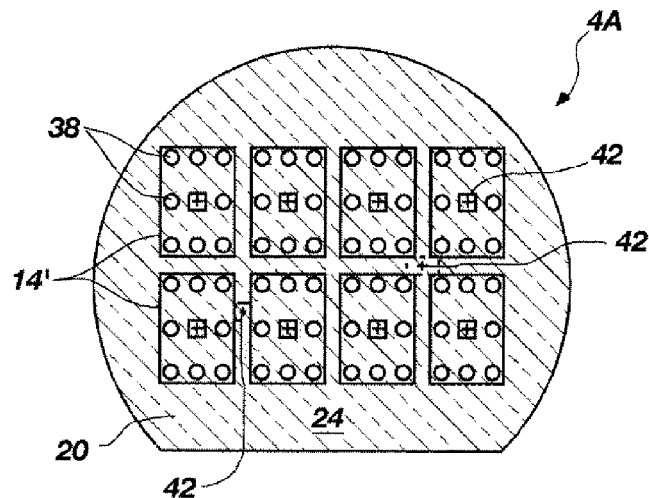
FIG. 2B is a schematic plan view of the semiconductor structures in accordance with embodiments of the invention taken along line 2B-2B of FIG. 1C.
Figure 2C:
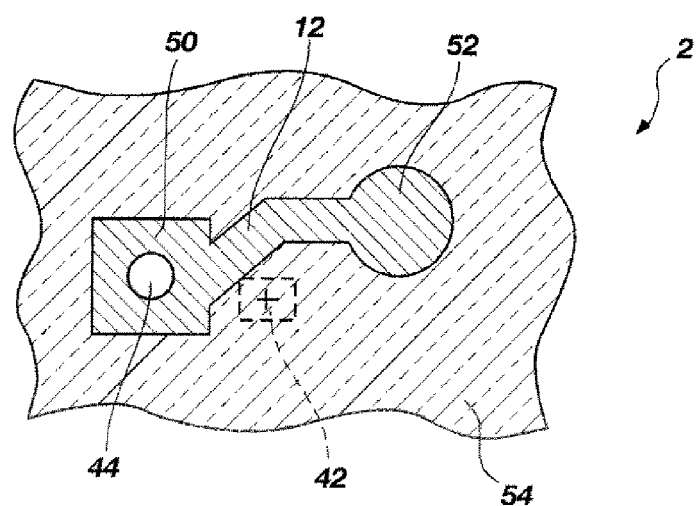
FIG. 2C is a schematic plan view of the semiconductor structures and semiconductor devices in accordance with embodiments of the invention taken along line 2C-2C of FIG. 1F.
Figure 3A:
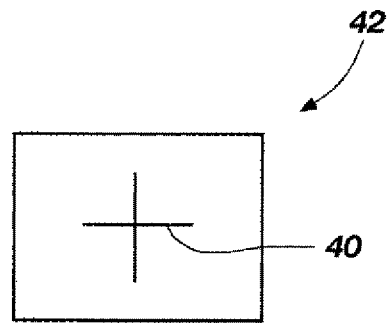
FIGS. 3A-3C are schematic views of alignment mark patterns formed on the semiconductor structures and semiconductor devices in accordance with embodiments of the invention.
Figure 3B:
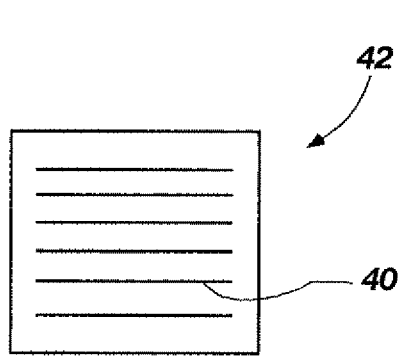
Figure 3C:
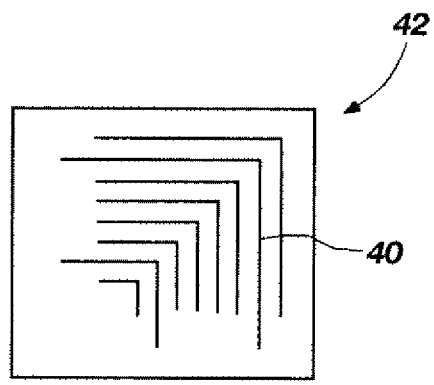

The sub-resolution alignment marks 40 may be detectable or distinguishable by conventional alignment techniques and conventional alignment apparatuses, such as by using a visible light alignment apparatus in conjunction with cameras equipped with microscopes. While the sub-resolution alignment marks 4 are readily visible in FIGS. 1C-1H, it is understood that, for clarity and convenience, the sub-resolution alignment marks 40 are not drawn to scale in these drawings. As known in the art a plurality of sub-resolution alignment marks 40 may be grouped together to form the pattern 42 (see FIGS. 2B, 2C, and 3A-3C) of sub-resolution alignment marks 40 that is detectable or distinguishable. By way of non-limiting example, the pattern 42 of sub-resolution alignment marks 40 may have dimensions of approximately 100 μm square. The sub-resolution alignment marks 40 in the pattern 42 may include a plurality of lines of dielectric material 34 separated from one another by spaces of from approximately 0.4 μm to approximately 10 μm. The sub-resolution alignment marks 40 in the pattern 42 may also be separated from one another by spaces of approximately 10 μm. The pattern 42 of sub-resolution alignment marks 40 may form a so-called "+" shape, as illustrated in FIG. 3A, or the shapes illustrated in FIGS. 3B and 3C. However, the pattern 42 of sub-resolution alignment marks 40 is not limited to any particular shape or configuration.

The sub-resolution alignment marks 40 and the openings 38 may be formed by exposing the dielectric material 34 to energy trough a reticle (not shown) and developing the dielectric material 34. The exposure energy may depend on the material selected as the dielectric material 34 and may be determined by a person of ordinary skill in the art in accordance with the manufacturer's specification. The sub-resolution alignment marks 40 may be formed on a desired location of the dielectric material 34 such that the sub-resolution alignment marks 40 do not interfere with subsequent processing of the wafer 20. The sub-resolution alignment marks 40 may be formed on the periphery of the dielectric material 34 or on other locations. While FIGS. 1C-1H show the sub-resolution alignment marks 40 as trenches on the periphery and in the middle of the wafer 20, the sub-resolution alignment marks 40 may be formed on different portions of the wafer 20 by appropriately configuring and positioning the reticle. As known in the art, the reticle may include a plurality of alignment mark apertures and a plurality of opening apertures (or a plurality of alignment mark features and a plurality of opening features) of a size substantially corresponding to the desired size of the openings 38 and the sub-resolution alignment marks 40 to be formed in the dielectric material 34. By way of non-limiting example, the reticle may include alignment mark apertures and opening apertures if the dielectric material 34 upon which the sub-resolution alignment marks 40 and openings 38 are to be formed is a positive photoresist material. The resulting sub-resolution alignment marks 40 may be trenches formed in the dielectric material 34. While the subsequent discussion herein assumes that the dielectric material 34 is a positive photoresist material, the dielectric material 34 may, instead, be a negative photoresist material. If a negative photoresist material is used, the reticle may include alignment mark features and opening features, and the resulting sub-resolution alignment marks 40 may be features, such as lines, in the dielectric material 34. The dimensions of the aliment mark apertures or alignment mark features may be sized to be smaller than the dimensions of the opening apertures or opening features to form the corresponding sub-resolution alignment marks 40 and openings 38. Since reticles and methods of fabricating reticles to include the desired apertures or features are known in the art, forming the reticle is not described in detail herein.

Since the alignment mark apertures in the reticle are relatively small, relative to the size of the opening apertures, the exposure energy may not fully penetrate regions of the dielectric material 34 below the alignment mark apertures. As such, the dielectric material 34 below the alignment mark apertures may be partially resolved (i.e., less than fully resolved). In other words, partial resolution of the dielectric material 34 below the alignment mark apertures may be achieved by appropriately sizing the alignment mark apertures in he reticle. Since the opening apertures in the reticle are larger, the exposure energy may penetrate regions of the dielectric material 34 below the opening apertures. As such, the regions of the dielectric material 34 below the opening apertures may be substantially resolved.

After exposure, the dielectric material 34 may be developed to produce the subs resolution alignment marks 40 and the openings 38. The development conditions for the dielectric material 34 may be determined by a person of ordinary skill in the art in accordance with the manufacturer's specification. After developing the dielectric material 34, at least a portion of the partially resolved dielectric material 34 remains on the substrate 14', while the fully resolved regions of the dielectric material 34 are removed. Development may remove from approximately 10% to approximately 75% of a total thickness of the partially resolved dielecic material 34 (the dielectric material 34 below the alignment mark apertures), while from approximately 25% to 90% of the thickness of the dielectric material 34 remains. The openings 38 may be formed on the dielectric material 34 to be in substantial alignment with the substrate contacts 26 on the front surface 22 of the substrate 14'. The size and shape of the openings 38 may be selected based on the size and shape of the substrate contacts 26. By way of non-limiting example, the dimensions of the openings 38 may be sized to be slightly smaller than the dimensions of the substrate contacts 26 and may have a circular shape or a polygonal shape.

In one embodiment, the dielectric material 34 is a positive tone or a negative tone photoresist material from JSR Micro, Inc. (Sunnyvale, Calif.) under the WPR tradename. The WPR series of photoresist materials are in a pre-marketing phase and have limited availability. The WPR series of photoresist materials are positive or negative photoresists having a low cure temperature and are capable of being formed at a thickness of from approximately 5 μm to approximately 20 μm. The JSR® WPR photoresist material may be deposited on the substrate 14' at a thickness of approximately 15 μm and heated at 110° C. on a hot plate for 3.5 minutes. After the pre-bake, the JSR® WPR photoresist material may be subjected to an exposure energy of approximately 1500 mJ/cm$^2$ through the reticle having the desired pattern and size of alignment mark apertures and opening apertures. The alignment mark apertures may form 0.5 μm sub-resolution alignment marks 40 on the JSR® WPR photoresist material. The JSR® WPR photoresist material may be developed using an aqueous solution of 0.26 N tetramethylammonium hydroxide ("TMAH") and rinsed with deionized water to form the sub-resolution alignment marks 40. The developed portions of the JSR® WPR photoresist material may be cured in an oven maintained at a temperature of 120° C. for 1 hour, ramped to 150° C. at 3° C./minute, maintained at 150° C. for 30 minutes, ramped to 200° C. at 3° C./minute, maintained at 200° C. for 1 hour, and ramped down to ambient temperature (approximately 25° C.) at 3° C./minute.

The ability to partially resolve the dielectric material 34 provides numerous advantages. First, since the alignment mark apertures and the opening apertures are present on a single reticle, the sub-resolution alignment marks 40 and the openings 38 in the dielectric material 34 may be formed at substantially the same time. As such, the sub-resolution alignment marks 40 may he formed without adding process acts to the overall fabrication, which saves costs associated with conducting these acts. Second, since the partially resolved dielectric material 34 remains on the substrate 14' (forming the sub-resolution alignment marks 40), the underlying regions of the substrate 14' are protected from subsequent processing acts, such as etching of the substrate 14' and metal deposition. Third, the partially resolved dielectric material 34 provides a sufficient resist budget for the subsequent processing acts. Fourth, by partially resolving the dielectric material 34 below the alignment mark apertures, the sub-resolution alignment marks 40 are not transferred into underlying materials, such as the substrate 14'. In contrast, by substantially resolving the dielectric material 34 below the opening apertures, underlying regions of the substrate 14' are exposed after development of the dielectric material 34. Fifth, by utilizing the partially resolved dielectric material 34 as the sub-resolution alignment marks 40, alignment accuracy may be improved by up to approximately three times relative to the alignment accuracy achieved by forming the unique vias previously describe. Sixth, since the sub-resolution alignment marks 40 are detectable, alignment may be automated, which improves throughput of fabricating the semiconductor structures 4A, 4B.

The sub-resolution aliment marks 40 and openings 38 may also be formed in the dielectric material 34 using multiple reticles and multiple exposure and development acts. By way of non-limiting example, the dielectric material 34 may he exposed to a first energy through a first reticle having the alignment mark apertures and exposed to a second energy through a second reticle having the opening apertures. The dimensions of the sub-resolution alignment marks 40 may be smaller than the resolution limit of the dielectric material 34. However, utilizing multiple reticles and multiple exposure and development acts may add additional acts to the process, increasing the time and cost of fabricating the semiconductor structures 4A, 4B.

The sub-resolution alignment marks in the dielectric material 34 may also be formed by producing a plurality of alignment mark apertures having a size below the resolution limit of the exposure tool (stepper or aligner) in the reticle (not shown). The dielectric material 34 may be exposed to energy through the alignment mark apertures in the reticle and developed, forming the sub-resolution alignment marks 40. The exposure energy may depend on the material selected as the dielectric material 34 and may be determined by a person of ordinary skill in the art in accordance with the manufacturer's specification. Since the alignment mark apertures in the reticle have a size below he resolution limit of the exposure tool, the exposure energy may not fully penetrate regions of the dielectric material 34 below the alignment mark apertures. As such, the dielectric material 34 below the alignment mark apertures may be partially resolved (i.e., less than fully resolved).

The sub-resolution alignment marks 40 may be used in subsequent alignment acts, such as aligning the semiconductor structures 4A, 4B with an appropriate reticle (not shown) for metal plating, as illustrated in FIGS. 1E-1H and described in more detail below. The sub-resolution alignment marks 40 may also be used for die-to-die or field-to-field alignment. The topography of the sub-resolution alignment marks 40 may be detectable or distinguishable by conventional alignment techniques and conventional alignment apparatuses through a conductive material 50 (see FIG. 1F) or other overlying materials. However, the sub-resolution alignment marks 40 may be used to align the work piece 10 with a reticle for other purposes, depending on the subsequent processing acts to be conducted. The sub-resolution alignment marks 40 may also be used for multiple processing acts, if the sub-resolution alignment marks 40 remain on the dielectric material 34.

Figure 1C:
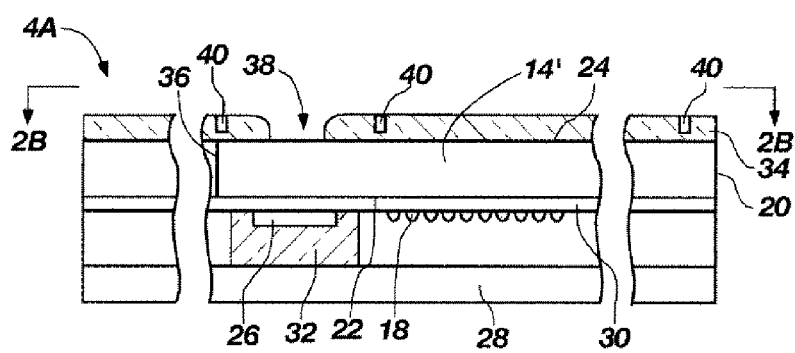
Figure 1D:
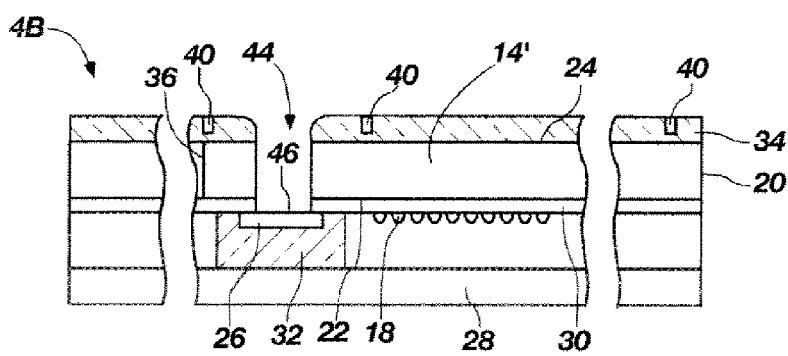
Figure 1E:
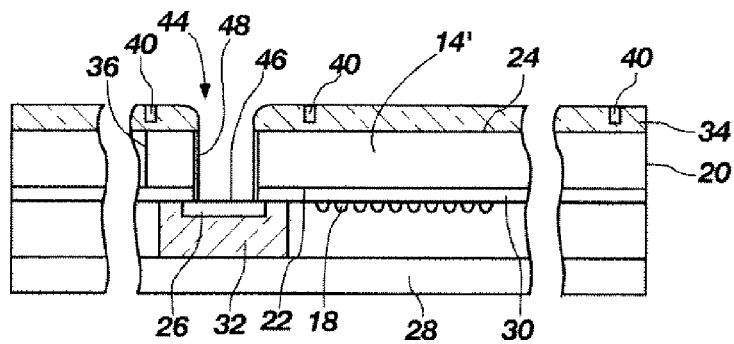

As illustrated in FIG. 1D, the openings 38 in the dielectric material 34 of FIG. 1C may be transferred into the substrate 14, forming vias 44, which are in substantial alignment with the substrate contacts 26 on the front surface 22 of the substrate 14'. The vias 44 are substantially perpendicular (orthogonal) to the back surface 24 of the substrate 14'. The vias 4 may be formed using a wet etch process or dry etch process that terminates at the electrical insulation material 30. The vias 44 may be formed using an anisotropic wet etch process that includes an aqueous solution of potassium hydroxide ("KOH"). Alternatively, the vias 44 may be formed using an isotropic wet etch process that includes an aqueous solution of hydrogen fluoride ("HF") and nitric acid ("HNO$_3$"). The size of the vias 44 may substantially correspond to the size of the substrate contacts 26. By way of non-limiting example, the vias 44 may have a diameter of from approximately 5 μm to approximately 2 mm. The electrical insulation material 30 exposed through the vias 44 may also be removed, exposing an upper surface 46 of the substrate contacts 26. The electrical insulation material 30 may be removed using an etch process, such as an oxide dry etch process.

Sidewalls of the vias 44 may be lined with a via insulation material 48, as illustrated in FIG. 1. The via insulation material 48 may be an electrically insulating polymer, such as a polyimide or a PARYLENE™ polymer, or SiO$_2$. The via insulation material 48 may be formed by a conventional deposition technique. Excess via insulation material 48 may be removed from the bottom of the vias 44, exposing the upper surface 46 of the substrate contacts 26.

Figure 1F:
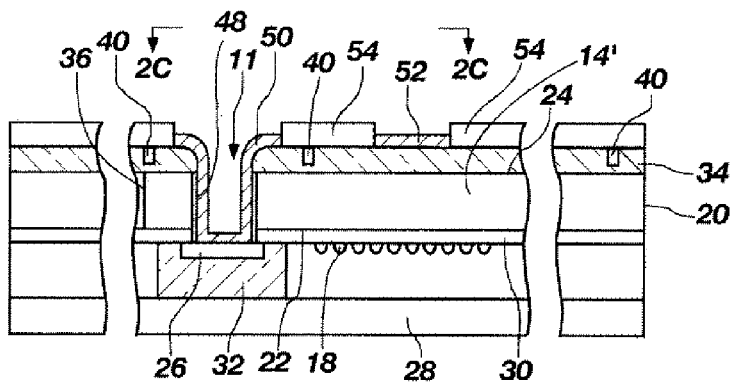

A seed material (not shown) may be formed in the vias 44 and over the dielectric material 34. By way of non-limiting example, the seed material may be copper and may be deposited by PVD. As illustrated in FIG. 1F, the conductive material 50 may be formed in the vias 44 and over the dielectric material 34 and seed material, if used, to provide physical and electrical contact with the substrate contacts 26. The conductive material 50 may be formed at a thickness of from approximately 1 μm to approximately 10 μm such that the vias 44 remain at least partially open. The conductive material 50 may be a metal, such as copper, nickel, aluminum, chromium, titanium, tungsten, gold, silver, tantalum, molybdenum, or mixtures thereof, or a polymer. If the conductive material 50 is to be formed by electroless or electrolytic deposition, a deposition mask 54 may be formed over the dielectric material 34 and patterned such that portions of the deposition mask 54 remain on the dielectric material 34 in locations where the conductive material 50 is not to be deposited. The deposition mask 54 may be formed from a resist material. The conductive material 50 may be formed on portions of the seed material not protected by the deposition mask 54. Alternatively, the conductive material 50 may be formed on the dielectric material 34 by CVD, PECVD, PVD, sputtering, or evaporation processes.

Figure 1G:
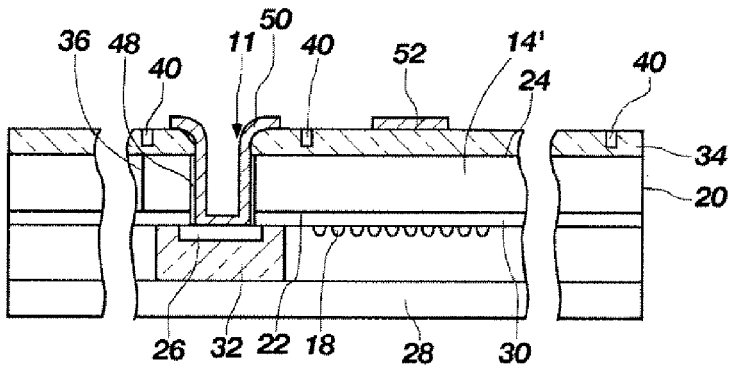

As illustrated in FIG. 1G, the deposition mask 54, if present, may be removed from the dielectric material 34, such as by using a plasma etch or other conventional process. The underlying seed material may also be removed, such as by using an etch process. By way of non-limiting example, the conductive material 50 may form through wafer interconnect ("TWI") 11, redistribution conductors 12, and terminal contact pads 52 for the terminal contacts 56 (see FIGS. 1F-1H and 2C). The TWI 11 may at least partially line the sidewalls of the vias 44 and the upper surface 46 of the substrate contacts 26. As such, the TWI 11, the redistribution conductors 12, and the terminal contact pads 52 may be formed using a single metal deposition act. In addition, since the TWI 11 is formed from the back surface 24, the front surface 22 of the substrate 14' may be protected from these processing acts.

Figure 1H:
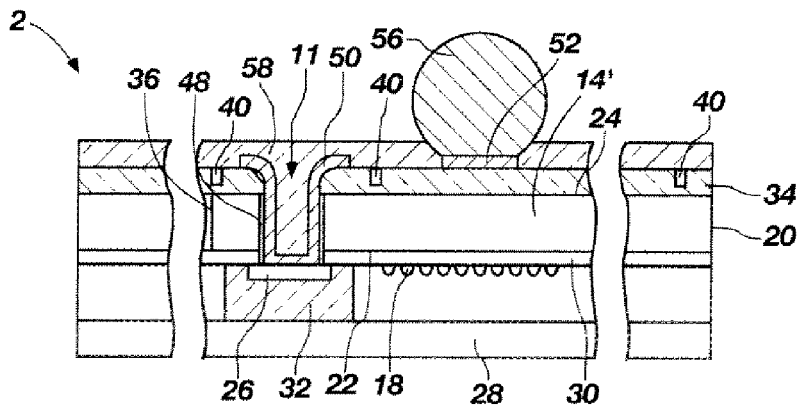

As illustrated in FIG. 1H, an outer insulation material 58 may be formed over the dielectric material 34 and in the vias 44. The outer insulation material 58 may substantially cover the conductive material 50 in the vias 44 and the redistribution conductors 12 (see FIG. 2C). The outer insulation material 58 may be a low dielectric constant ("low k") material, such as polyimide, polybenzoxazole, or benzocyclobutene. The outer insulation material 58 may be patterned and cured to expose the terminal contact pads 52. Terminal contacts 56 or outer lead bonds ("OLBs") may be formed on the terminal contact pads 52, producing semiconductor device 2. The terminal contacts 56 may be metal or solder balls, bumps, columns, studs or pins and may be formed by conventional techniques. The terminal contacts 56 may also be in electrical communication with the TMI 11, which form inner lead bonds ("ILBs"). In addition, prior to forming the terminal contacts 56, under bump metallization materials (not shown) may be formed on the terminal contact pads 52. After forming the terminal contacts 56, individual semiconductor dice may be singulated from the wafer 20. The singulation may be conducted by conventional techniques, such as by using a dicing saw configured to dice the wafer 20 into the semiconductor die. Alternatively, the wafer 20 may be singulated by cutting with a laser or water jet, or by etching.

Additional acts may be utilized to process and incorporate the semiconductor device 2 into an electronic device or system including, but not limited to, a wireless device, personal computer, digital camera, cellular telephone, personal digital assistant ("PDA"), or other electronic device. These additional processing acts are known in the art and, therefore, are not described in detail herein.

While the invention is susceptible to various modifications as well as alternative forms and implementations, specific embodiments have been shown by way of example in the drawings and have been described in detail herein. However, it should be understood that the invention is not limited to the particular embodiments disclosed. Rather, the invention encompasses all modifications, equivalents, and alternatives falling within the spirit and scope of the invention as defined by the following appended claims.

What is claimed is:

1. A method of fabricating a semiconductor structure, comprising:

forming at least one sub-resolution alignment mark extending partially into a dielectric material; and forming at least one opening in a location different than the at least one sub-resolution alignment mark in the dielectric material.

2. The method of claim 1, wherein forming at least one sub-resolution alignment mark comprises depositing a photodefinable material having dielectric properties when cured.

3. The method of claim 1, wherein forming at least one sub-resolution alignment mark and forming at least one opening in the dielectric material comprises simultaneously forming the at least one sub-resolution alignment mark and the at least one opening.

4. The method of claim 1, wherein forming at least one sub-resolution alignment mark comprises sizing at least one of a width, length, and diameter of the at least one sub-resolution alignment mark below a resolution limit of the dielectric material.

5. The method of claim 4, wherein sizing at least one of a width, length, and diameter of the at least one sub-resolution alignment mark comprises sizing the at least one of the width, length, and diameter of the at least one sub-resolution alignment mark from approximately 10% to approximately 75% of the resolution limit of the dielectric material.

6. The method of claim 4, wherein sizing at least one of a width, length, and diameter of the at least one sub-resolution alignment mark below a resolution limit of the dielectric material comprises selecting the dielectric material to exhibit a resolution limit of approximately 2 µm.

7. The method of claim 4, wherein sizing at least one of a width, length, and diameter of the at least one sub-resolution alignment mark below a resolution limit of the dielectric material comprises sizing the at least one of the width, length, and diameter of the at least one sub-resolution alignment mark at from approximately 0.4 µm to approximately 0.9 µm.

8. The method of claim 1, wherein forming at least one sub-resolution alignment mark comprises exposing the dielectric material through a reticle comprising at least one alignment mark aperture and removing from approximately 10% to approximately 75% of a total thickness of the exposed dielectric material.

9. The method of claim 1, wherein forming at least one sub-resolution alignment mark comprises forming at least one trench extending partially into the dielectric material.

10. The method of claim 1, wherein forming at least one sub-resolution alignment mark comprises forming at least one line extending partially into the dielectric material.

11. The method of claim 1, further comprising extending the at least one opening in the dielectric material to form at least one via in a substrate underlying the dielectric material.

12. The method of claim 11, further comprising forming a conductive material in the at least one via.

13. The method of claim 1, further comprising using the at least one sub-resolution alignment mark to align a semiconductor structure comprising the dielectric material, the at least one sub-resolution alignment mark, the at least one opening in the dielectric material, and a reticle.

14. A method of fabricating a semiconductor structure, comprising:

forming at least one alignment mark extending partially into a dielectric material on a substrate;

forming at least one opening into the dielectric material in a location different than the at least one alignment mark in the substrate;

aligning the at least one alignment mark with a reticle; and forming a metal in the at least one opening.

15. The method of claim 14, wherein forming at least one alignment mark comprises forming the at least one alignment mark on the periphery of the substrate.

16. The method of claim 14, wherein forming at least one alignment mark comprises forming the at least one alignment mark on scribe areas of the substrate.

17. A method of fabricating a semiconductor structure, comprising:
    exposing a dielectric material to energy through a reticle comprising a plurality of alignment mark apertures and a plurality of opening apertures; and
    developing the dielectric material to form at least one alignment mark extending partially into the dielectric material and at least one opening in a location different than the at least one alignment mark in the dielectric material.

18. The method of claim 17, wherein exposing a dielectric material to energy and developing the dielectric material comprises simultaneously forming the at least one alignment mark and the at least one opening.

* * * * *